(12) United States Patent
Flaherty et al.

(10) Patent No.: US 11,205,991 B2
(45) Date of Patent: Dec. 21, 2021

(54) PHOTOVOLTAIC MODULE FOR ROOFS

(71) Applicant: LUMETA HOLDINGS, LLC, Newport Beach, CA (US)

(72) Inventors: Brian J. Flaherty, Alamo, CA (US); Timothy M. Davey, Costa Mesa, CA (US)

(73) Assignee: LUMETA HOLDINGS, LLC, Newport Beach, CA (US)

( * ) Notice: Subject to any disclaimer, the term of this patent is extended or adjusted under 35 U.S.C. 154(b) by 0 days.

(21) Appl. No.: 16/508,067

(22) Filed: Jul. 10, 2019

(65) Prior Publication Data

US 2019/0386603 A1   Dec. 19, 2019

Related U.S. Application Data

(63) Continuation of application No. 12/430,241, filed on Apr. 27, 2009, now abandoned, which is a continuation of application No. 11/771,338, filed on Jun. 29, 2007, now Pat. No. 7,531,740, which is a continuation-in-part of application No. 11/615,934, filed on Dec. 22, 2006, now Pat. No. 7,557,291.

(51) Int. Cl.
*H02S 20/24*     (2014.01)
*H01L 31/048*   (2014.01)
*F24S 25/60*    (2018.01)

(52) U.S. Cl.
CPC ............ *H02S 20/24* (2014.12); *H01L 31/048* (2013.01); *F24S 2025/601* (2018.05); *Y02B 10/10* (2013.01); *Y02E 10/50* (2013.01)

(58) Field of Classification Search
None
See application file for complete search history.

(56) References Cited

U.S. PATENT DOCUMENTS

| | | |
|---|---|---|
| 3,780,424 A | 12/1973 | Forestieri et al. |
| 3,874,931 A * | 4/1975 | Haynos ................ H01L 31/042 |
| | | 136/244 |
| 4,040,867 A | 8/1977 | Forestieri et al. |

(Continued)

FOREIGN PATENT DOCUMENTS

| | | |
|---|---|---|
| CN | 1112732 A | 11/1995 |
| CN | 1271964 A | 11/2000 |

(Continued)

OTHER PUBLICATIONS

Communication: Supplementary European Search Report; and the European Search Opinion for European Patent Application No. 07812531.7 dated Jun. 21, 2010.

(Continued)

*Primary Examiner* — Tamir Ayad
(74) *Attorney, Agent, or Firm* — Katten Muchin Rosenman LLP

(57) ABSTRACT

A photovoltaic module generates electrical power when installed on a roof. The module is constructed as a laminated sandwich having a transparent protective upper layer adhered to a photovoltaic layer. The photovoltaic layer is adhered to a rigid layer formed from a fiber reinforced plastic. The laminated sandwich has a frame around the perimeter. The laminated panel has a layer of double stick tape on the bottom to adhere the panel to the surface of a roof.

6 Claims, 2 Drawing Sheets

(56) References Cited

U.S. PATENT DOCUMENTS

| | | | |
|---|---|---|---|
| 4,162,174 A | 7/1979 | Kaplow et al. | |
| 4,167,644 A * | 9/1979 | Kurth | H01L 31/048 |
| | | | 136/244 |
| 4,371,739 A | 2/1983 | Lewis et al. | |
| 4,419,531 A | 12/1983 | Lang et al. | |
| 4,461,922 A | 7/1984 | Gay et al. | |
| 4,499,658 A | 2/1985 | Lewis | |
| 4,636,577 A | 1/1987 | Peterpaul | |
| 4,636,578 A | 1/1987 | Feinberg | |
| 4,860,509 A | 8/1989 | Laaly et al. | |
| 5,228,925 A | 7/1993 | Nath et al. | |
| 5,409,549 A * | 4/1995 | Mori | E04D 3/366 |
| | | | 136/244 |
| 5,447,576 A | 9/1995 | Willis | |
| 5,501,744 A | 3/1996 | Albright et al. | |
| 5,503,684 A | 4/1996 | Duran | |
| 5,582,653 A | 12/1996 | Kataoka et al. | |
| 5,590,495 A * | 1/1997 | Bressler | H01L 31/048 |
| | | | 136/244 |
| 5,746,839 A | 5/1998 | Dinwoodie | |
| 5,768,831 A | 6/1998 | Melchior | |
| 5,968,287 A * | 10/1999 | Nath | H01L 31/048 |
| | | | 136/251 |
| 5,986,203 A | 11/1999 | Hanoka et al. | |
| 6,093,757 A | 7/2000 | Pern | |
| 6,093,884 A | 7/2000 | Toyomura et al. | |
| 6,235,984 B1 | 5/2001 | Wambach et al. | |
| 6,283,542 B1 | 9/2001 | Patz | |
| 6,437,235 B1 | 8/2002 | Komori et al. | |
| 6,489,552 B2 | 12/2002 | Yamawaki et al. | |
| 6,553,729 B1 | 4/2003 | Nath et al. | |
| 6,653,549 B2 | 11/2003 | Matsushita et al. | |
| 6,729,081 B2 | 5/2004 | Nath et al. | |
| 7,083,696 B2 | 8/2006 | Meuwissen et al. | |
| 2002/0029799 A1* | 3/2002 | Yoda | H02S 40/38 |
| | | | 136/251 |
| 2002/0174889 A1 | 11/2002 | Shugar et al. | |
| 2004/0000334 A1 | 1/2004 | Ressler | |
| 2005/0072456 A1 | 4/2005 | Stevenson et al. | |
| 2005/0161074 A1 | 7/2005 | Garvison et al. | |
| 2005/0161080 A1 | 7/2005 | Nieleck et al. | |
| 2005/0126622 A1 | 9/2005 | Mukai | |
| 2005/0178428 A1 | 9/2005 | Laaly et al. | |
| 2005/0178429 A1 | 9/2005 | McCaskill et al. | |
| 2005/0199278 A1 | 9/2005 | Aschenbrenner | |
| 2006/0042683 A1 | 3/2006 | Gangemi | |
| 2006/0124166 A1* | 6/2006 | Romijn | H02S 99/00 |
| | | | 136/246 |
| 2008/0099062 A1 | 5/2008 | Armstrong et al. | |
| 2008/0149169 A1 | 6/2008 | Flaherty et al. | |
| 2008/0149168 A1 | 9/2008 | Flaherty et al. | |
| 2008/0245404 A1 | 10/2008 | DeLiddo | |

FOREIGN PATENT DOCUMENTS

| | | | |
|---|---|---|---|
| EP | 1056138 A2 | 11/2000 | |
| JP | H06-085306 A | 3/1994 | |
| WO | 2004066324 | 8/2004 | |
| WO | WO2004/066324 * | 8/2004 | H01G 31/05 |

OTHER PUBLICATIONS

"Eternabond Double Stick," Eternabond, Inc., Hawthorn woods, Illinois, USA, product brochure, publication date unknown, 1 page.

Final Rejection dated Jan. 8, 2009, from U.S. Appl. No. 11/615,934, 21 sheets.

Non-Final Rejection dated Aug. 7, 2008, from U.S. Appl. No. 11/615,934, 25 sheets.

Final Rejection dated Jan. 9, 2009, from U.S. Appl. No. 11/771,338, 31 sheets.

Non-Final Rejection dated Aug. 8, 2008, from U.S. Appl. No. 11/771,338, 23 sheets.

Final Rejection dated Jan. 10, 2019, from U.S. Appl. No. 12/430,241, 41 sheets.

Non-Final Rejection dated Apr. 6, 2018, from U.S. Appl. No. 12/430,241, 24 sheets.

Non-Final Rejection dated Jun. 12, 2017, from U.S. Appl. No. 12/430,241, 41 sheets.

Non-Final Rejection dated Nov. 16, 2016, from U.S. Appl. No. 12/430,241, 37 sheets.

Non-Final Rejection dated May 25, 2016, from U.S. Appl. No. 12/430,241, 39 sheets.

Non-Final Rejection dated Jan. 29, 2016, from U.S. Appl. No. 12/430,241, 32 sheets.

Final Rejection dated Jun. 26, 2015, from U.S. Appl. No. 12/430,241, 26 sheets.

Non-Final Rejection dated Aug. 17, 2011, from U.S. Appl. No. 12/430,241, 20 sheets.

Non-Final Rejection dated Jan. 4, 2011, from U.S. Appl. No. 12/430,241, 33 sheets.

Non-Final Rejection dated Jul. 21, 2010, from U.S. Appl. No. 12/430,241, 30 sheets.

Non-Final Rejection dated Dec. 9, 2009, from U.S. Appl. No. 12/430,241, 39 sheets.

"AluFiber," Euramax Coated Products BV, Roermond, The Netherlands, product description, publication date unknown, 2 pages.

Office Action and search report for Chinese Patent Application No. 201210187812.2 dated Jul. 25, 2014.

* cited by examiner

PHOTOVOLTAIC MODULE FOR ROOFS

RELATED APPLICATIONS

The present application is a continuation of U.S. patent application Ser. No. 12/430,241, filed Apr. 27, 2009, which is a continuation of U.S. patent application Ser. No. 11/771,338, filed Jun. 29, 2007 (now U.S. Pat. No. 7,531,740, issued May 12, 2009), which is a continuation-in-part application of U.S. patent application Ser. No. 11/615,934, filed Dec. 22, 2006 (now U.S. Pat. No. 7,557,291, issued Jul. 7, 2009), the contents of all incorporated herein by reference.

BACKGROUND OF THE INVENTION

1. Field of the Invention

The present invention relates to solar panels for generating electrical energy and more particularly relates to photovoltaic modules integrated into a laminated, weather resistant sandwich for installation on flat roofs.

2. Description of the Related Art

Conventional photovoltaic panels for generating electrical power for residences and businesses are flat and are placed on a portion of a roof that is exposed to the sun. Historically, such panels were placed on structures erected on the roof to support and protect the panels. More recently, photovoltaic panels have become available that can be mounted directly on a flat roof. See, for example, US Patent Application Publication No. 2005/0178248 A1 to Laaly et al., which discloses a panel that incorporates a roofing membrane into the panel structure. The panel is intended to be installed on a new roof or replacement roof with the membrane providing moisture protection for the underlying structure as well as providing electrical power. Although generally suitable for roofing applications, the additional membrane adds unnecessary manufacturing costs and requires additional steps to install on a roof.

SUMMARY OF THE INVENTION

The photovoltaic panel described herein and illustrated in the attached drawings enables the electricity-generating solar panel to be installed on an existing flat roof directly over an existing roof. The panel is formed in the size and shape of conventional 4-foot by 8-foot panels that are easily mounted using tape or other suitable adhesive systems. The panel does not include a membrane, and is easier to manufacture and install.

In accordance with aspects of a preferred embodiment of the invention, a photovoltaic panel comprises a lower rigid substrate, a middle photovoltaic layer having electrical output connectors, and an upper transparent protective layer. The layers are formed into a laminated sandwich with the layers fixed to each other by a heat-activated, transparent adhesive, such as, for example, ethylene-vinyl-acetate (EVA). The layers and coating of EVA act as binders and cushions for the layers of the laminated photovoltaic panel. Other suitable adhesives, such as, for example, polyvinyl-buterol (PVB), or another pottant material that acts as a binder and cushion can be substituted for the EVA.

The middle photovoltaic layer comprises a plurality of electrically interconnected photovoltaic cells. For example, the middle photovoltaic layer advantageously comprises 160 photovoltaic cells arranged in an array of rows and columns.

The upper transparent upper layer preferably comprises a suitable thickness of waterproof, chemically resistant resin, such as, for example, fluorinated ethylene propylene (FEP) resin. Such a resin is commercially available from E.I du Pont de Nemurs and Company as DuPont™ Teflon® FEP film. The FEP film is a transparent, thermoplastic film that can be heat sealed, thermoformed, vacuum formed, heat bonded, or the like to produce the transparent upper layer. In preferred embodiments, the upper transparent layer is softened during a curing process to allow a portion of the transparent layer to form a protective layer along the sides of the laminated structure.

The photovoltaic panel further includes an outer frame that surrounds the outer edges of the laminated sandwich. Preferably, the outer frame is secured to the laminated sandwich by a silicon adhesive or other suitable waterproof adhesive. In preferred embodiments, the bottom of the rigid substrate is secured to the existing roof by a layer of double-stick tape, such as, for example, a self-sealing tape having a formulation of resins, thermoplastics and non-curing rubbers. A suitable double-stick tape is marketed by Eternabond, Inc., of Hawthorn Woods, Ill., USA, as Eternabond™ Double Stick™.

BRIEF DESCRIPTION OF THE DRAWINGS

Certain aspects in accordance with embodiments of the present invention are described below in connection with the accompanying drawing figures in which.

DETAILED DESCRIPTION OF THE PREFERRED EMBODIMENTS

Figure 1:
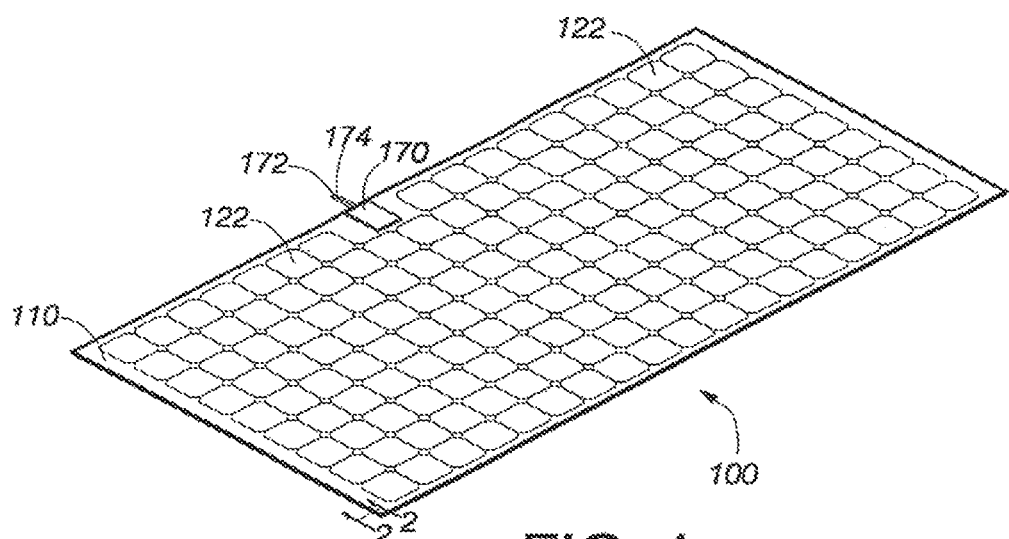
FIG. 1 illustrates a perspective view of an exemplary embodiment of a laminated photovoltaic panel.
Figure 2:
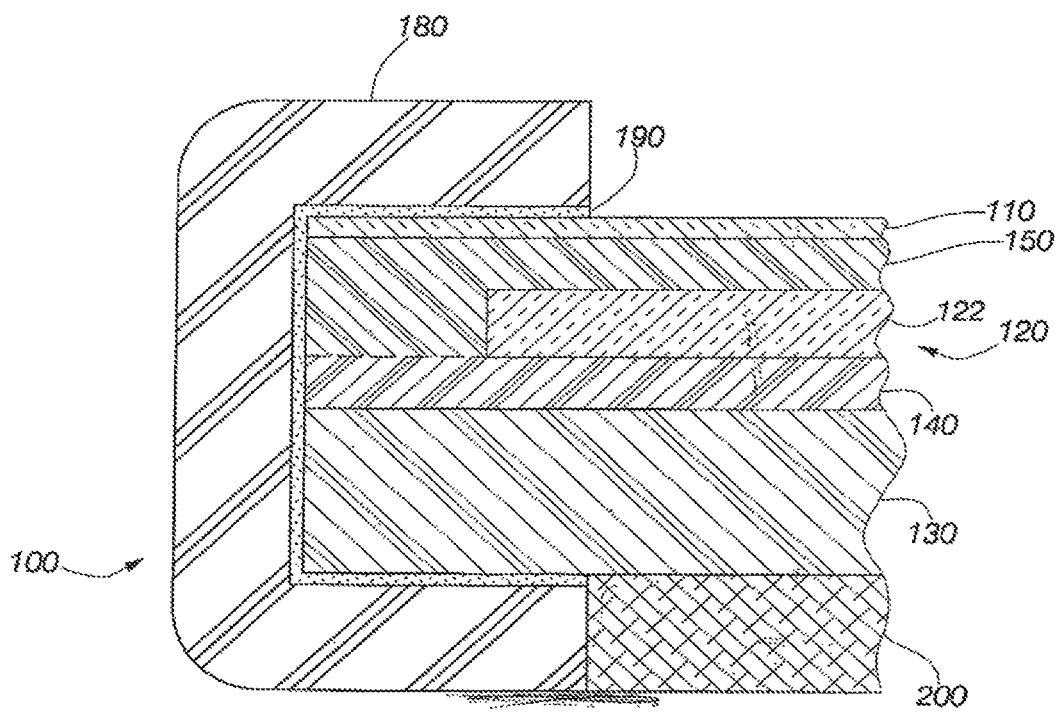
FIG. 2 illustrates an enlarged cross-sectional view of the photovoltaic panel of FIG. 1 taken along the lines 2-2 in FIG. 1.
Figure 3:
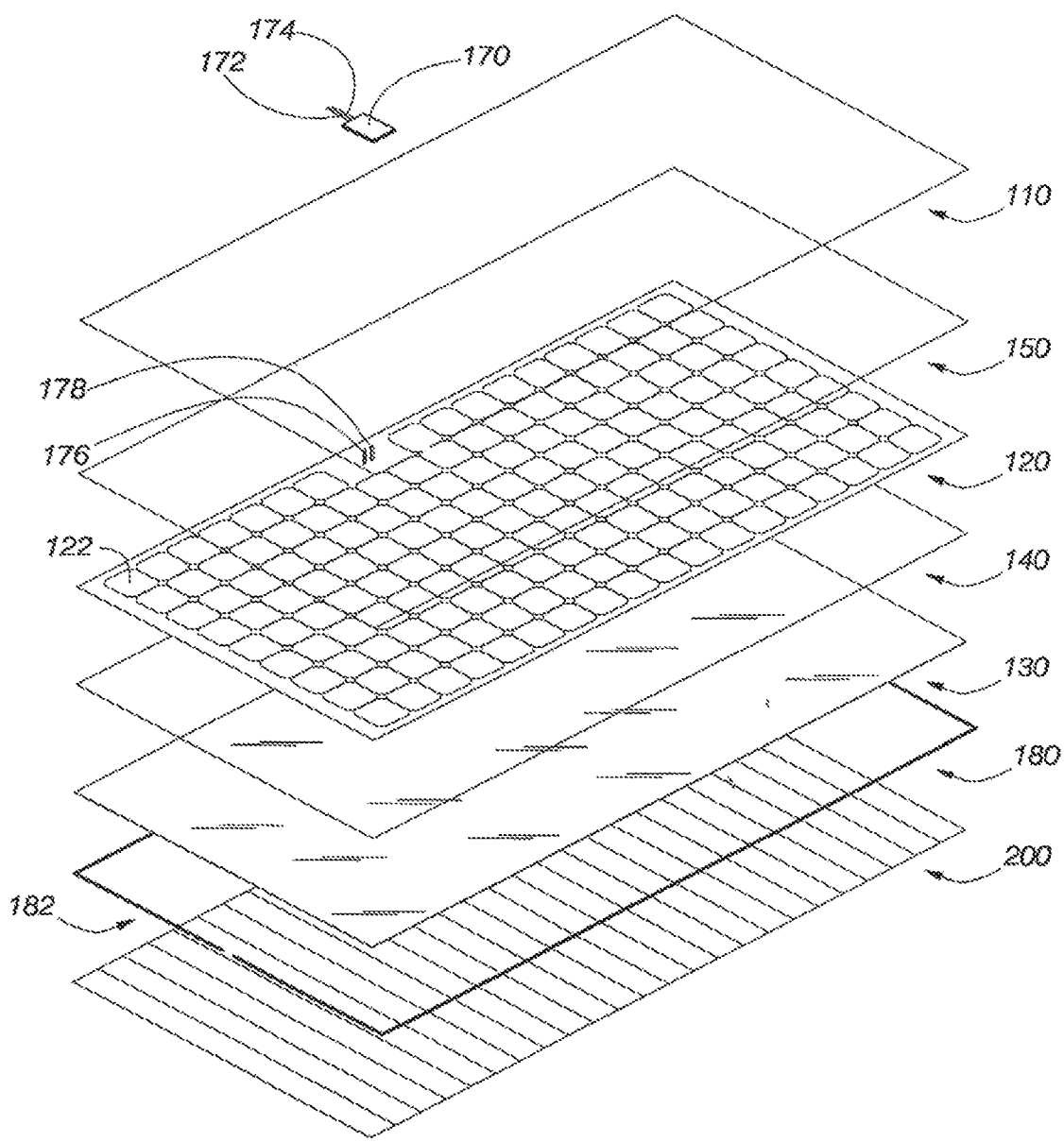
FIG. 3 illustrates an exploded perspective view of the photovoltaic panel of FIG. 1.

As illustrated in FIGS. 1, 2 and 3, a laminated photovoltaic panel 100 is configured as a generally rectangular panel, which is sized and shaped in accordance with the sizes and shapes of conventional building materials. Thus, the panel 100 can be handled by a construction crew without requiring any special material handling equipment. The panel 100 is assembled in a factory or other suitable environment so that the panel 100 is complete and ready to install on a flat roof or other location having adequate exposure to the sun. In the illustrated embodiment, the panel 100 has dimensions of approximately 243.840 centimeters (96 inches (8 feet)) by 121.920 centimeters (48 inches (4 feet)) and has a thickness of less than approximately 0.508 centimeter (0.2 inch) when installed. Thus, the panel 100 does not add significant height to a roof structure. Although not intended to be used as a walking surface, the panel 100 has sufficient structural integrity to support the weight of a construction worker or a roofing inspector and to resist the impact of objects dropped on the panel 100.

The panel 100 has a transparent upper protective layer 110 that faces upward and is exposed to the sun. A middle layer 120 is positioned beneath the upper protective layer 110. The middle layer 120 comprises a plurality of photovoltaic cells 122 electrically interconnected to form an photovoltaic array. The middle layer 120 rests on a rigid lower layer 130. The middle layer 120 is secured to the rigid lower layer 130 by a lower adhesive layer 140. The middle layer 120 is secured to the upper protective layer 110 by an upper adhesive layer 150. The middle layer 120 is thus encapsulated between the lower adhesive layer 140 and the upper adhesive layer 150.

The upper protective layer 110 provides impact protection as well as weather protection to the panel 100. The upper protective layer 110 advantageously comprises DuPont™ TeflonR™ fluorinated ethylene propylene (FEP) resin, which is formed into a film layer of suitable thickness (e.g., approximately 0.254 centimeter (0.1 inch)). Thus, the photovoltaic cells 122 in the middle layer 120 are exposed to direct sunlight without being exposed to moisture and other climatic conditions and without being exposed to direct impact by feet, falling objects, and debris. Tempered glass having a suitable thickness may also be used as the upper protective layer 110.

In the illustrated embodiment, the rigid lower layer 130 comprises fiber reinforced plastic (FRP). For example, the FRP layer advantageously comprises a polyester resin with embedded stranded glass fibers. In one advantageous embodiment, the FRP layer has a thickness of approximately 0.20066 centimeter (0.079 inch). The rigid lower layer of FRP provides an advantageous combination of rigidity, light weight, very low permeability, and flatness.

Preferably, the lower adhesive layer 140 is provided as a thin film that is positioned on the upper surface of the rigid lower layer 130. The array of photovoltaic cells 122 in the middle layer 120 is then positioned on the lower adhesive layer 140. In the illustrated embodiment, the lower adhesive layer 140 advantageously comprises a transparent adhesive, such as, for example, ethylene-vinyl-acetate (EVA). EVA is a transparent, heat-activated adhesive that is particularly suitable for securing the cells. Other suitable adhesives, such as, for example, polyvinylbuterol (PVB), or other pottant materials, can be substituted for the EVA.

After positioning the array of photovoltaic cells 122 on the lower adhesive layer 140, the upper transparent adhesive layer 150 is placed over the middle layer 120 so that the photovoltaic cells 122 are sandwiched between the two transparent adhesive layers. The upper adhesive layer 150 should match the physical characteristics of the lower adhesive layer. In the illustrated embodiment, both the upper adhesive layer 150 and the lower adhesive layer 140 comprise EVA, but other suitable transparent adhesives can be substituted for the EVA. The transparent upper protective layer 110 is then positioned over the upper transparent adhesive layer 150 to complete the laminated structure shown in an enlarged partial cross section in FIG. 2.

The EVA material and the use of the EVA material to bind the layers of a laminated photovoltaic cell are described, for example, in U.S. Pat. No. 4,499,658 to Lewis. In addition to acting as a binder to secure the photovoltaic cells 122 between the upper protective layer 110 and the lower rigid layer 130, the upper EVA layer 150 and the lower EVA layer 140 also act as a cushion between the two outer layers.

The photovoltaic cells 122 are electrically interconnected in a series-parallel configuration in a conventional manner to provide a suitable output voltage. For example, in the illustrated embodiment, 160 photovoltaic cells 122 are arranged in 9 rows of 18 cells each; however, the two cells are omitted from the uppermost row to provide room for positioning a junction box 170 having a first weather-resistant electrical conductor 172 and a second weather-resistant electrical conductor 174. As shown in FIG. 3, the photovoltaic panel 100 includes two panel output conductors 176, 178 that extend from the top surface of the middle layer 120 in the area of the omitted photovoltaic cells. Each of the panel output conductors 176, 178 is connected to a respective one of the weather-resistant electrical conductors 172, 174 within the junction box 170 after the photovoltaic panel 100 is laminated, as discussed below.

The upper protective layer 110, the middle layer 120, the lower layer 160, and the two adhesive layers 140 and 150 are stacked in the order shown in FIGS. 2 and 3 and are aligned to form the sandwich structure shown in FIGS. 1, 2 and 3. The free end of each of the panel output conductors 176, 178 are covered with a temporary covering (e.g., a cloth tube, or the like) during the lamination process. The structure is permanently laminated in a known manner using heat and pressure. In one advantageous embodiment, the structure is laminated in a vacuum laminator in the manner described, for example, in US Patent Application Publication No. 2005/0178248 A1 to Laaly et al. In particular, the structure is first subjected to a vacuum to remove any trapped gas bubbles in the EVA adhesives. The structure is then subjected to high pressure to force the layers together as tightly as practical. The structure is then heated to a suitable temperature (e.g., approximately 160 C. degrees to cure the adhesives in the layers 140 and 150 and thereby permanently bond the adjacent layers.

The laminated structure is held at the high temperature for a sufficient time to cure the upper transparent adhesive layer 150 and the lower transparent adhesive layer 140 and to cause the two transparent adhesive layers to adhere together to become a combined layer that completely encapsulates the photovoltaic cells 122. The high temperature also causes the upper transparent layer 110 to soften and flow to provide the protective upper coating described above. The laminated structure is then allowed to cool to ambient temperature.

Although the resulting laminated structure is moisture resistant and is sufficiently strong to withstand the flexing that may occur during ordinary handling of the panel 100 during normal conditions, an additional structural element is added in the preferred embodiment in order to improve the moisture resistance and the structural stability. In particular, the panel 100 further includes a weather-resistant plastic frame shown in FIG. 3. In a preferred embodiment, the frame comprises a first frame half 180 and a second frame half 182. The frame halves are positioned around the edges of the laminated structure as shown in the cross-sectional view in FIG. 2 for the first frame half 180. The exposed ends of the two frame halves are butted together to form a complete frame around the perimeter of the panel 100. Although shown as two separate frame halves, it should be understood that a single length of frame material can also be used by bending the material around the edges of the panel 100 and butting the two free ends.

As further illustrated in FIG. 2, the frame halves 180, 182 preferably comprise a plastic extrusion with a U-shaped cross section having a wall thickness of approximately 0.127 centimeter (0.05 inch). For example, the plastic material advantageously comprises polyvinylchloride (PVC), thermoplastic polyolefin (TPO) or another suitable material. In the illustrated embodiment, the two parallel legs of the U-shaped extrusion have lengths of approximately 0.47625 centimeter (0.1875 inch) measured from the inside of the base of the extrusion. The width of the base of the U-shaped extrusion is selected to accommodate the thickness of the laminated layers of the panel 100. In the illustrated embodiment, the inside width of the base is selected to be approximately 0.4572 centimeter (0.18 inch).

In the illustrated embodiment, each frame half 180, 182 surrounds approximately one-half of the outer perimeter of the panel 100. As further shown in FIG. 2, each frame half is secured to the outside edge of each layer and to a portion of the upper surface of the upper layer 110 and a portion of the lower surface of the rigid lower layer 130 by a layer 190 of a suitable adhesive. For example, in one embodiment, the adhesive layer 190 advantageously comprises a silicon adhesive, which is sufficiently strong to permanently fix the frame halves 180, 182 to the panel 100. After positioning the frame halves on the panel 100, the ends of the frame half 180 may be secured to the respective ends of the frame half 182 by gluing or another suitable method if desired. As discussed above, if a single length of frame material is used, the two ends of the frame may be connected at a single location.

After the lamination process is completed and the two frame halves 180, 182 are secured to the edges of the panel 100, the junction box 170 is secured to the upper layer 110 in a conventional manner (e.g., using silicon adhesive). As the junction box 170 is installed, the two panel output conductors 176, 178 extending from the photovoltaic layer 120 are passed through a hole (not shown) in the bottom of the junction box 170. The temporary coverings over the two panel output conductors 176, 178 are removed, and the two panel output conductors 176, 178 are electrically connected within the junction box 170 to the two weather-resistant external conductors 172, 174 using conventional interconnection devices. A removable top of the junction box 170 is then secured over the conductor interconnection devices to provide a weather-resistant seal.

As shown in FIGS. 2 and 3, the preferred method of installation of the panel 100 comprises applying a layer 200 of tape to the bottom surface of the rigid lower layer 130. Preferably, the tape layer 200 comprises a suitable double-stick tape, such as, for example, a self-sealing tape having a formulation of resins, thermoplastics and non-curing rubbers. A suitable self-sealing double-stick tape is marketed by Eternabond, Inc., of Hawthorn Woods, Ill., USA, as Eternabond™ Double Stick™. The double-stick tape is adhesive on both sides. When manufactured, the double-stick tape has a release layer on each side to prevent adhesion. One release layer is advantageously removed during the process of manufacturing the panels. The exposed adhesion side of the tape layer 200 is positioned on and adhered to the bottom surface of the rigid lower layer 130 before shipping the panel 100. Then, during installation of the panel 100, the remaining release layer is removed so that the panel can be adhered to the surface of an existing roof. The surface of the existing roof is cleaned and suitably prepared to receive the panel 100. After installation, suitable pressure is applied to the upper layer 110 of the panel 100 to permanently adhere the panel to the surface of the roof. In FIG. 2, the tape layer 200 is illustrated as comprising a plurality of narrow strips of tape (e.g., 10.16 centimeter (4-inch) widths). The tape can also be obtained in wider widths to improve the manufacturing process.

The present invention is disclosed herein in terms of a preferred embodiment thereof, which provides an exterior building panel as defined in the appended claims. Various changes, modifications, and alterations in the teachings of the present invention may be contemplated by those skilled in the art without departing from the intended spirit and scope of the appended claims. It is intended that the present invention encompass such changes and modifications.

What is claimed is:

1. A photovoltaic module mounted on a roof, comprising:
   a weather-resistant and impact-resistant upper transparent protective layer comprising fluorinated ethylene propylene;
   a middle photovoltaic layer below the upper transparent protective layer, the middle photovoltaic layer comprising a plurality of photovoltaic cells having electrical outputs;
   a lower rigid layer below the middle photovoltaic layer, the lower rigid layer comprising fiber reinforced plastic;
   the upper transparent protective layer, the middle photovoltaic layer, and the lower rigid layer forming a laminated sandwich structure with the layers fixed to each other by at least one heat-activated transparent adhesive, the at least one heat-activated transparent adhesive comprising ethylene-vinyl-acetate, the laminated sandwich having a thickness of substantially 0.5 centimeters;
   a first frame half and a second frame half positioned on respective edges of the sandwich structure;
   at least one junction box disposed above the upper transparent protective layer and configured to connect the electrical outputs of the photovoltaic cells, the at least one junction box being affixed to the photovoltaic module with at least one adhesive; and
   a plurality of self-sealing, double-stick tape portions, which extend between the first frame half and the second frame half, sticking to both the lower rigid layer and the roof, absent any other structure between the lower rigid layer and the roof, to directly attach the sandwich structure to the roof.

2. The photovoltaic module according to claim 1, wherein the module is usable as a walking surface.

3. The photovoltaic module according to claim 1, wherein the module is substantially 4 feet wide by 8 feet long.

4. The photovoltaic module according to claim 1, wherein the plurality of photovoltaic cells are disposed in a two-dimensional matrix array.

5. The photovoltaic module according to claim 1, wherein the upper transparent protective layer has a thickness of substantially 0.2 centimeters.

6. The photovoltaic module according to claim 1, wherein the lower rigid layer has a thickness of substantially 0.2 centimeters.

* * * * *